United States Patent
Thin et al.

(10) Patent No.: US 11,503,697 B2
(45) Date of Patent: Nov. 15, 2022

(54) WIRING OF A HIGH RESOLUTION LIGHT SOURCE

(71) Applicant: VALEO VISION, Bobigny (FR)

(72) Inventors: Guillaume Thin, Bobigny (FR); Antoine De Lamberterie, Bobigny (FR); Samira Mbata, Bobigny (FR); Thomas Canonne, Bobigny (FR); Van Thai Hoang, Bobigny (FR); Vincent Dubois, Bobigny (FR); Francois-Xavier Amiel, Bobigny (FR); Nicolas Lefaudeux, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 16/333,912

(22) PCT Filed: Aug. 4, 2017

(86) PCT No.: PCT/EP2017/069846
§ 371 (c)(1),
(2) Date: Mar. 15, 2019

(87) PCT Pub. No.: WO2018/050355
PCT Pub. Date: Mar. 22, 2018

(65) Prior Publication Data
US 2019/0208616 A1    Jul. 4, 2019

(30) Foreign Application Priority Data
Sep. 15, 2016  (FR) ....................... 1658663

(51) Int. Cl.
*H05K 1/02*     (2006.01)
*F21V 23/00*   (2015.01)
(Continued)

(52) U.S. Cl.
CPC ......... *H05K 1/0203* (2013.01); *B60Q 1/0017* (2013.01); *F21S 41/141* (2018.01);
(Continued)

(58) Field of Classification Search
CPC .... B60Q 1/0017; F21S 41/141; F21S 41/151; F21S 41/153; F21S 41/192; F21S 45/47;
(Continued)

(56) References Cited

U.S. PATENT DOCUMENTS 6,586,826 B1 * 7/2003 Glenn .................... H01L 23/13
257/642
2001/0050428 A1 * 12/2001 Ando .................... H01L 24/32
257/E21.503
(Continued)

FOREIGN PATENT DOCUMENTS

DE    20 2004 003 793 U1   6/2004
DE    10 2011 017 790 A1   10/2012
(Continued)

OTHER PUBLICATIONS

International Search Report dated Sep. 6, 2017 in PCT/EP2017/069846 filed on Aug. 4, 2017.
(Continued)

*Primary Examiner* — Zheng Song
(74) *Attorney, Agent, or Firm* — Oblon, McClelland, Maier & Neustadt, L.L.P.

(57) ABSTRACT

A terrestrial vehicle lighting module which includes an electroluminescent source including at least one electroluminescent element, an electronic device designed to control the electroluminescent element, and an interposer electrically connecting the electroluminescent source and the electronic device.

20 Claims, 3 Drawing Sheets

(51) Int. Cl.
*F21S 41/663* (2018.01)
*B60Q 1/00* (2006.01)
*F21S 41/19* (2018.01)
*F21S 41/153* (2018.01)
*F21S 41/141* (2018.01)
*F21S 45/47* (2018.01)
*F21Y 115/10* (2016.01)
*F21Y 105/10* (2016.01)
*H01L 25/075* (2006.01)
*H05K 3/46* (2006.01)
*H01L 23/00* (2006.01)
*F21Y 105/16* (2016.01)
*F21W 107/10* (2018.01)

(52) U.S. Cl.
CPC ........... *F21S 41/153* (2018.01); *F21S 41/192* (2018.01); *F21S 41/663* (2018.01); *F21S 45/47* (2018.01); *F21V 23/005* (2013.01); *F21W 2107/10* (2018.01); *F21Y 2105/10* (2016.08); *F21Y 2105/16* (2016.08); *F21Y 2115/10* (2016.08); *H01L 24/11* (2013.01); *H01L 25/0753* (2013.01); *H01L 2224/16225* (2013.01); *H01L 2924/15192* (2013.01); *H05K 1/0298* (2013.01); *H05K 3/46* (2013.01); *H05K 2201/10106* (2013.01); *H05K 2201/10113* (2013.01); *H05K 2201/10378* (2013.01)

(58) Field of Classification Search
CPC . F21V 23/005; F21Y 2105/10; H05K 1/0203; H05K 2201/10378; H01L 2224/16225; H01L 2224/13147; H01L 2924/1433
See application file for complete search history.

(56) References Cited

U.S. PATENT DOCUMENTS

| | | | |
|---|---|---|---|
| 2004/0223328 A1* | 11/2004 | Lee | B60Q 1/2607 362/249.01 |
| 2005/0152146 A1* | 7/2005 | Owen | A61L 2/10 362/294 |
| 2010/0032725 A1* | 2/2010 | Baba | G11C 13/0011 257/211 |
| 2011/0149588 A1* | 6/2011 | Schnerr | B60Q 1/0094 362/545 |
| 2011/0254034 A1 | 10/2011 | Konsek et al. | |
| 2012/0161633 A1* | 6/2012 | Nishitani | F21V 23/007 315/117 |
| 2014/0042489 A1* | 2/2014 | Preuschl | H01L 33/64 257/99 |
| 2014/0239327 A1 | 8/2014 | Konsek et al. | |
| 2015/0049477 A1 | 2/2015 | Huang et al. | |
| 2015/0282260 A1* | 10/2015 | Hussell | H01L 25/50 315/51 |
| 2016/0165680 A1* | 6/2016 | Johnson | F21K 9/00 315/51 |
| 2016/0290621 A1* | 10/2016 | Ozawa | F21S 43/195 |
| 2016/0320004 A1* | 11/2016 | Tudorica | F21V 29/76 |
| 2017/0318636 A1* | 11/2017 | Kums | F21S 41/153 |
| 2017/0343180 A1* | 11/2017 | Ishiyama | F21V 19/003 |

FOREIGN PATENT DOCUMENTS

| | | |
|---|---|---|
| DE | 10 2011 079 473 A1 | 1/2013 |
| EP | 2 838 117 A1 | 2/2015 |
| JP | 3172019 | 3/2001 |
| JP | 2015-167123 A | 9/2015 |
| WO | WO 2010/014032 A1 | 2/2010 |

OTHER PUBLICATIONS

Combined Chinese Office Action and Search Report dated Sep. 27, 2020 in Chinese Patent Application No. 201780057004.5 (with English translation), 11 pages.

* cited by examiner

WIRING OF A HIGH RESOLUTION LIGHT SOURCE

FIELD OF THE INVENTION

The invention relates to the field of lighting modules for terrestrial vehicles, in other words modules that may be integrated into a lighting device of the vehicle and, when the vehicle is used, allowing the projection of light illuminating the road or the passenger compartment and/or allowing the vehicle to make itself more visible. Examples of such lighting devices are the position lights or the low-beam and/or high-beam lights (commonly referred to as "headlamps").

BACKGROUND

A terrestrial vehicle is equipped with lighting devices, notably for illuminating and/or signalling, such as front headlights or rear lights, designed to illuminate the road in front of the vehicle, at night or in the case of reduced lighting conditions. They may also be used to illuminate the passenger compartment of the vehicle. These lighting devices may comprise one or more lighting modules. Each lighting function may be provided by one or more module(s).

In these lighting modules for terrestrial vehicles, semiconductor light sources are increasingly being used. These light sources may consist of light-emitting diodes (or LEDs), of organic light-emitting diodes (or OLEDs), or else of polymeric light-emitting diodes (or PLEDs). These light sources notably offer size and lifetime advantages with respect to conventional light sources such as for example filament bulbs.

The use of these new light sources offers new prospects in the improvement of the illumination performance provided by the lighting devices of a vehicle. Notably, the use of monolithic arrays of LEDs allow the areas of a scene that are to be illuminated, and with what brightness, to be selected with a very high precision. A monolithic array comprises hundreds or thousands of LEDs which are situated on the same substrate, the LEDs being separated from others by lanes or streets. In this monolithic array context, the LEDs are also called pixels. However, each of the LEDs is electrically independent from the others and hence illuminates autonomously from the other LEDs of the array. For this purpose, each LED of the array is individually controlled by the electronic circuit which manages its electrical power supply (circuit referred to as a "driver"), which implies that the higher the density of LEDs, the greater will be the number of wires for electrically powering the LEDs.

In order to render the wiring of the electrical power supply of the LEDs of an array feasible, the technique referred to as "stacking" is known which consists in stacking the array of LEDs with the circuit that manages its electrical power supply (or "driver"). However, there are numerous technical constraints which limit the feasibility of such stackings. First of all, the thermal dissipation is degraded owing to the very stacking of the array of LEDs with its driver. This is an important problem since the heat generated by the LEDs leads to a rise in the temperature within the components which may degrade the components and/or prevent their optimal use. Furthermore, the driver itself generates heat and may be destroyed by the heat produced by the LEDs. In addition, there are constraints on the geometry of the driver which is generally implemented on an ASIC (acronym for "Application-Specific Integrated Circuit"). Indeed, the standardized dimensions of the ASIC must correspond to those of the array which comply with other standards in order to obtain a lighting module of the smallest possible size. However, the current standards do not offer any correspondences between these various dimensions such that the differences in sizes between the driver and the array of LEDs are too great.

SUMMARY OF THE INVENTION

For this purpose, a terrestrial vehicle lighting module is provided comprising an electroluminescent source comprising at least one electroluminescent element, an electronic device designed to control the electroluminescent element, an interposer electrically connecting the electroluminescent source and the electronic device.

According to various examples, the lighting element according to the invention may comprise one or more of the following features combined together:
- the electroluminescent source and the electronic device are arranged on at least one face of the interposer;
- a heat dissipator is arranged on one face of the interposer;
- the electroluminescent source and the electronic device are arranged on a first face of the interposer, and the heat dissipator is arranged against a second face of the interposer;
- the heat dissipator is arranged against the face of the interposer via an intermediate element which comprises at least one from amongst: a thermal paste, a layer of copper, an adhesive;
- the interposer comprises at least one from between an inorganic material and an organic material;
- the inorganic material comprises at least one from amongst: silicon, glass, ceramic;
- the electronic device comprises at least one power converter and/or one integrated circuit;
- a passive and/or active electronic component;
- the electronic component is arranged on and/or in the interposer;
- the interposer comprises at least one metal track electrically connecting the electronic device and the said at least one electroluminescent element of the electroluminescent source;
- the electroluminescent source comprises at least two electroluminescent elements electrically connected in series, and the interposer comprises at least one metal track electrically connecting the electronic device and the said at least two electroluminescent elements electrically connected in series;
- at least one electrical connector arranged on the interposer and electrically connected to the electronic device;
- the electroluminescent source is a monolithic array of light-emitting diodes.

A lighting device is also provided, notably an illuminating and/or signalling device preferably for a terrestrial vehicle, comprising the lighting element hereinabove.

BRIEF DESCRIPTION OF THE FIGURES

Various embodiments of the invention will now be described, by way of non-limiting examples, referring to the appended drawings in which.

DETAILED DESCRIPTION

Figure 1:
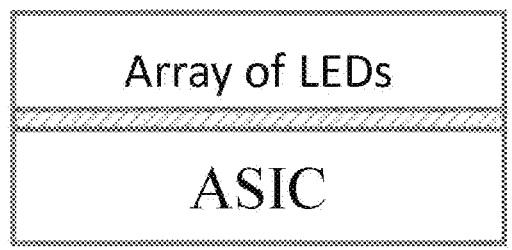
FIG. 1 shows schematically an electronic device according to the prior art.

FIG. 1 shows one example of a lighting element known in the prior art under the terminology "stacked ASIC": the array of LEDs rests on the ASIC circuit allowing its electrical power supply. The interface between the array of LEDs and the driver is shown with hatching. This interface may comprise adhesive in order to ensure that the array of LEDs remains in contact with the driver.

Figure 2:
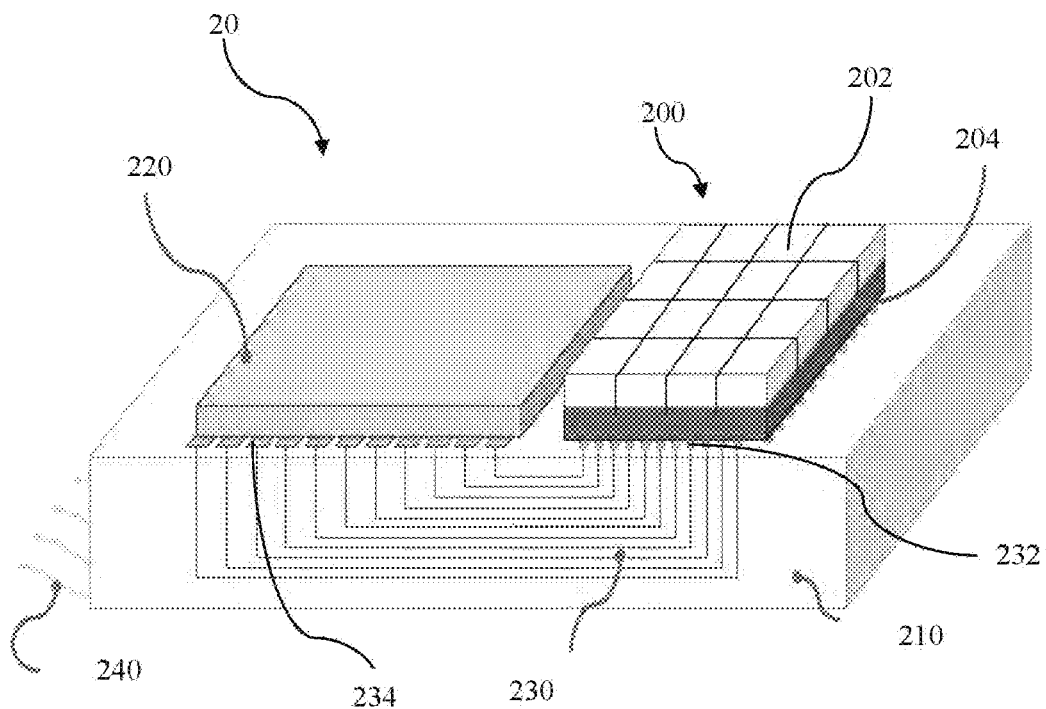
FIG. 2 shows schematically one example of a lighting element according to the invention.

FIG. 2 shows one example of the lighting element according to the invention. The lighting element may be a terrestrial vehicle lighting module. One or more lighting module(s) may constitute, or may be integrated into, a lighting device. The lighting device may be a front headlight, a rear light or a lighting apparatus for the passenger compartment. A terrestrial vehicle is also provided comprising one or more versions of such a lighting device (for example one or more pairs of versions at the front and/or one or more pairs of versions at the rear for a four-wheeled vehicle, or one or more versions at the front and/or one or more versions at the rear for a two- or three-wheeled vehicle).

The lighting element 20 comprises at least one electroluminescent source 200 comprising at least one electroluminescent element 202. The electroluminescent source is a solid-state lighting source which comprises at least one electroluminescent element. The electroluminescent element may be, but is not limited to, a light-emitting diode (LED), an organic light-emitting diode (OLED), a polymeric light-emitting diode (PLED). The electroluminescent source is therefore a semiconductor light source and it comprises a substrate 204 from which the electroluminescent elements extend. An electroluminescent element is more generally called a pixel. Accordingly, the lighting element comprises at least one plurality of pixels deposed on or extending from the first face of the substrate 204.

The electroluminescent elements may each be semiconductor elements, in other words they each comprise at least one semiconductor material. The electroluminescent elements may for the most part be made of semiconductor material. This semiconductor material may be the same as or different from the semiconductor material of the substrate. The electroluminescent elements may more generally all be made of the same material or materials. The electroluminescent elements may be of the same nature, for example substantially identical or similar. All the electroluminescent elements may be positioned so as to form a regular pattern, for example a grid.

The elements are electroluminescent. This means that they emit light when the material of the electroluminescent elements is supplied with electricity. A pixel is therefore referred to as lit when an electroluminescent element emits light. The electroluminescent elements use electroluminescence to emit light. Electroluminescence is an optical and electrical phenomenon during which a material emits light in response to an electrical current flowing through it, or to a high electric field. This is to be distinguished from the emission of light by reason of the temperature (incandescence) or of the action of chemical products (chemiluminescence).

In a first example, the electroluminescent source is a monolithic electroluminescent source, also referred to as monolithic array of LEDs. A monolithic array comprises hundreds or thousands of electroluminescent elements which are situated on the same substrate 204, and preferably on the same face of the substrate which may for example be made of sapphire. The LEDs of the monolithic array are separated from one another by "lanes" or "streets". The monolithic array is therefore a grid of electroluminescent elements or else a grid of pixels. Each of the electroluminescent elements of the array is electrically independent from the others and emits or does not emit light independently of the other elements of the array. Each element of the array is individually controlled by an electronic circuit called a "driver". Alternatively, electroluminescent elements may be grouped electrically, for example by electrically supplying them by means of a configuration in parallel or in series, in order to reduce the number of elements to be managed. For example, the groups may comprise between two and four electroluminescent elements, this number allowing a sufficiently pixelized light beam to be conserved. The driver manages the electrical power supply of the monolithic array, which amounts to saying that it individually controls the electrical power supply of each electroluminescent element. The driver is therefore an electronic device which is designed to control the elements of a monolithic array of electroluminescent elements.

In a second example, the lighting element comprises at least one semiconductor electroluminescent source comprising a substrate 204 for the most part made of semiconductor material. Reference may thus be made to the substrate using the expression "semiconductor substrate". The substrate may comprise one or more other materials, for example non-semiconductor. The electroluminescent source also comprises one or more assemblies of electroluminescent elements extending from a first face of the substrate. Accordingly, the lighting element comprises at least one plurality of such elements extending from the first face of the substrate. Each assembly is made up of several elements extending from a respective portion of the first face of the substrate. The electroluminescent elements may therefore be distributed within various light emission areas. In one example, these various areas may be selectively activatable. The elements may have the general shape of a rod and thus be referred to as "rods".

Again, in this second example, the electroluminescent elements may be supplied with electricity via the substrate on one side (e. g. the substrate for example forming the cathode) and via a layer of electrically conductive material which electrically connects the electroluminescent elements together on the other side (e.g. the layer of electrically conductive material for example forming the anode). The contact between the semiconductor material of each electroluminescent element and the semiconductor material of the substrate may therefore be adapted to an electrical conduction. The layer of electrically conductive material may cover the electroluminescent elements. The layer of electrically conductive material may also cover each portion of surface of the substrate from which the electroluminescent elements extend, or the whole surface or face of the substrate from which the assemblies of electroluminescent elements extend. The layer of electrically conductive material may be electrically insulated from the semiconductor material of the substrate by any means. This allows the electroluminescent elements to be supplied with electricity via the substrate. Thus, the electroluminescent elements may be supplied with electricity in a simple manner, in other words by supplying the conductive material of the substrate with one polarity and the layer of electrically conductive material with the other polarity.

Again, in this second example, the electroluminescent source may be fabricated by a method comprising at least one step for supplying the substrate, then a step for integrated formation of the rods with the substrate, by growth starting from the substrate. The layer of electrically conductive material may be formed by a step for deposition of a metal finishing, for example of copper, in order to provide the driving of the rods. This step may also comprise the creation of aluminium or copper pads on one face of the substrate, designed for wiring by wire between the source and the driver component. Wiring by wire ("wire bonding" or "ribbon bonding") is one of the techniques used to make the electrical connections between the electroluminescent source and the device for supplying power to the source. The wiring is simply formed by a wire (or bridge) soldered between the two connection lugs provided for this purpose on each of the elements. The soldering may be carried out by ultrasound. The material of the wire may be aluminium, gold or copper. The diameter of the wire may be of the order of 20 μm. A wire with a rectangular cross-section may also be used.

Preferably, the electroluminescent source is a monolithic electroluminescent source, e. g. that described in the preceding first example. A monolithic source is a source having a high density of pixels (or else electroluminescent elements). In practice, it may be considered that the electroluminescent source is a monolithic electroluminescent source if the density of pixels is greater than or equal to 400 pixels per square centimetre ($cm^2$). In other words, the distance between the centre of a first pixel and the centre of a second pixel neighbouring the first is equal to or less than 500 micrometres (μm); this distance is also called "pixel pitch".

The lighting element according to the invention comprises one (or several) electronic device(s) 220 designed to control the electroluminescent elements of the electroluminescent source. Such an electronic device may for example be an integrated circuit or a power converter.

A power converter is a device for conversion of an electrical supply from an electrical power supply system of the vehicle into an electrical supply adapted to the implementation of a desired lighting function, and potentially to provide the said electrical power supply adapted to an electroluminescent source for the implementation of the said desired lighting function.

An integrated circuit, also referred to as electronic chip, is an electronic component reproducing one or more electronic functions and which can integrate several types of basic electronic components, for example in a reduced volume (i.e. on a small substrate). This makes the circuit easy to implement.

The integrated circuit may for example be an ASIC or an ASSP.

An ASIC (acronym for "Application-Specific Integrated Circuit") is an integrated circuit developed for at least one specific application (in other words for a customer). An ASIC is therefore a specialized (micro-electronic) integrated circuit. In general, it groups a large number of unique or customized functionalities.

An ASSP (acronym for "Application-Specific Standard Product") is an integrated electronic (micro-electronic) circuit grouping a large number of functionalities in order to satisfy a generally standardized application. An ASIC is designed for a need that is more specific than an ASSP.

The electrical power supply of the electroluminescent source, and hence of the electroluminescent elements, is implemented via the electronic device, itself supplied with electricity by means for example of at least the connector connecting it to a source of electricity. The electronic device then supplies the electroluminescent elements with electricity. The electronic device is thus designed to control the electroluminescent elements.

The lighting element also comprises an interposer 210 electrically connecting the electroluminescent source 200 and the electronic device 220. The interposer is an electrical interface allowing the electricity to be routed between two connectors. In other words, the interposer is a substrate which allows at least two connectors to be connected together. The routing of a connection between two connectors may be achieved by means of an electrically conductive track. A track may be formed on the substrate of the interposer, in other words at the surface of one or more faces of the interposer. A track may be formed within the substrate of the interposer, in other words where the track is inside the substrate of the interposer. A track may comprise a part on the substrate and a part in the substrate of the interposer. The interposer may comprise any given combination of the three types of tracks previously described. A track comprises at least two connectors situated at either of each end of the track and allowing an electrical contact with a connector of the electroluminescent source and a connector of the electronic device. In FIG. 2, the track 230 is formed inside of the substrate of the interposer and comprises a first end 232 connected with a connector of an electroluminescent element 202 of the electroluminescent source 200 and a second end 234 connected with a connector of the ASIC 220 implementing the driver of the electroluminescent source 200.

The tracks of the interposer are generally metal since metals provide a good conductivity of electricity; for example, the tracks are made of copper.

The interposer comprises a substrate which offers an electrical isolation between the various tracks that it comprises. The material or materials composing the substrate of the interposer may be an inorganic and/or organic material.

The inorganic materials mainly comprise, but are not limited to, synthetic and natural glasses, enamels, ceramics, stones, etc. Preferably, the substrate of the interposer may comprise a material or a combination of materials selected from amongst silicon, glass, and ceramic; silicon and glass are advantageous materials because their physical properties allow a track density to be obtained that is greater than those offered by other materials. In other words, silicon and glass allow an electrical isolation to be provided between two tracks with a distance between these two tracks that is less than that which would be necessary with another material such as ceramic. Silicon is the material allowing the best thermal dissipation compared with glass which offers the advantage of being less expensive.

The organic materials comprise, but are not limited to, epoxy, and polyimide such as that marketed under the name Kapton, and silicone.

Generally speaking, the substrate forming the interposer must have a good resistance to heat. The use of inorganic materials such as those previously presented facilitates the transmission of heat out of the lighting element.

The interposer may have the general shape of a plate, with two opposing faces. The electroluminescent source and the electronic device may each be arranged on a different face of the interposer, or else on the same face of the interposer. Arranged means that there is a first contact between one face of the interposer and the electroluminescent source, and a second contact between a face of the interposer and the electronic device. The contact is preferably permanent. The permanent contact is made for example by soldering, by bonding, by any given process such as for example "flip chip", "reflow", "copper pillar", "micro tubes", "thermosonic AuSn", "hybrid bonding", etc.

The lighting element may furthermore comprise at least one heat dissipator which is arranged on at least one face of the interposer. The heat dissipator allows the transfer of the heat from the electroluminescent source that the latter transmits to the interposer during the use of a lighting element. The electroluminescent source and the cooperation between the heat dissipator and the interposer therefore allow a terrestrial vehicle lighting module to be obtained that is simple to produce and to install in a vehicle lighting device, resulting in a relatively small size, compact and exhibiting a good capacity to dissipate heat.

The heat dissipator allows a dissipation of heat via a cooperation with the substrate of the interposer, in other words where the heat dissipator receives the heat produced by the electroluminescent source. The heat dissipator is thus in thermal communication with the interposer which is itself in thermal communication with the electroluminescent source.

The transmission may be provided by the fact that the heat dissipator is, in one example, arranged directly against the interposer. This means that the heat dissipator is in physical (i.e. material) contact with the interposer.

The heat dissipator may however be alternatively arranged against the interposer via an intermediate element which improves the heat transfer. The intermediate element is arranged between the interposer and the heat dissipator. The intermediate element may comprise for example thermal compound or a phase-change material. The intermediate element may comprise copper; for example the intermediate element is a copper plate. The intermediate element may also be an adhesive which maintains the heat dissipator held against the interposer.

FIG. 2 shows one example in which the electroluminescent source 200 and the electronic device 220 are arranged on the same face of the interposer 210. This configuration is particularly advantageous since it allows a heat dissipator (not shown in the figure) to be arranged on the opposite face of the interposer.

Figure 2A:
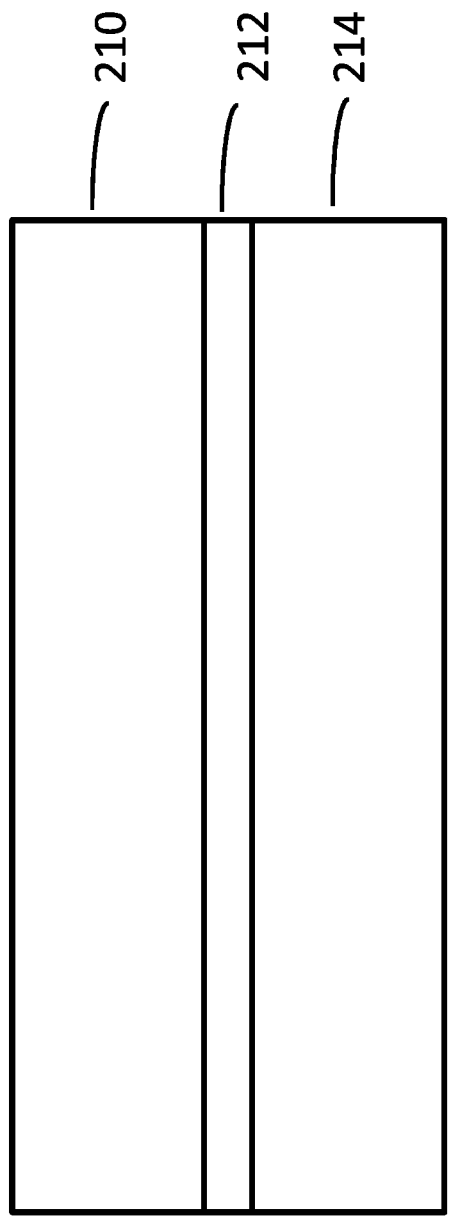
FIG. 2A shows a heat dissipator attached to the interposer.

FIG. 2A shows heat dissipator 214 attached to the lower face of the interposer 210 using intermediate material 212.

Again, in the example in FIG. 2, the electronic device comprises a control electronic device, it being understood that it could comprise several of them. This electronic device may be configured to interact with the electroluminescent elements of the lighting element, for example in order to individually control the emission or non-emission of light from each element. It will be understood that the arrangement in FIG. 2 allows the electronics for controlling the lighting element to be as close as possible to the heat dissipator. Since these electronics also generate heat, this solution allows the dissipation of heat to be optimized. Furthermore, this solution allows the compactness of the lighting element to be improved, by primarily avoiding a control electronic device separated from the lighting element and hence the provision of additional space and the addition of the necessary connector. Indeed, in the prior art such as illustrated in FIG. 1, a driver fixed on the component of a LED module leads to a self-heating of the LED by the driver, which can reduce the performance in light intensity. Similarly, the driver is in turn heated by the LED, hence thermally more sensitive. In the prior art, this may lead to an increase in size of the heat dissipator for the purposes of a given level of cooling.

The lighting element according to the invention may furthermore comprise one or more passive electronic components, in other words electronic components that do not amplify an electrical signal. Alternatively, the lighting element according to the invention may furthermore comprise one or more active electronic components, in other words electronic components that amplify an electrical signal. It will be understood that the lighting element may comprise both passive and active electronic components. These electronic components may for example be ESD protection capabilities, protection Zener diodes, and bin resistors. These components may form part of the electronic circuit for control and protection of the electroluminescent source. It will also be understood that other elements of the lighting element may comprise passive and/or active electronic components; for example, the control may be a component active and/or passive electronic device. This (or these) passive and/or active electronic component(s) may be arranged, at least in part, on one face of the interposer; the arrangement is for example implemented as previously discussed for the light source and the electronic device.

This (or these) passive and/or active electronic component(s) may be arranged in the interposer, in other words it is implemented within the substrate of the interposer. In other words, the interposer plays not only the role of support medium for electrically conductive tracks, but also for electronic component(s). For example, it may be envisaged for the interposer to be used as a substrate 204 for the electroluminescent elements of the electroluminescent source. It may also be envisaged for the interposer to implement the electronic device designed to control the electroluminescent elements.

The lighting element may also comprise at least one electrical connector 240 arranged on the interposer and electrically connected to the electronic device. The connector allows the lighting element to be supplied with electricity when the connector 240 is connected to an electrical source external to the lighting element. In practice, the lighting element comprises at least three connectors for supplying DC current to the lighting element; for example, a first connector powers the module with a positive voltage, a second with a negative voltage, and a third provides a ground. The ground can act as a low voltage (0 volt). The presence of connectors facilitates the addition or the removal of the lighting element in a device using this lighting element on the principle of an SiP (acronym for "System in Package"). For example, the lighting element according to the invention may easily be added by snap fit or screwing into a car headlamp; it may similarly easily be removed from a headlamp and replaced if it is defective.

The monolithic electroluminescent sources have a high density of pixels. The interposer of the lighting element according to the invention provides a substrate via which it is possible to electrically connect the light source with the electronic device since the interposer allows a sufficiently high number of electrical tracks to be provided so that each element of the electroluminescent source is controllable by the electronic device. However, in order to reduce the number of tracks that need to be routed over the interposer, several electroluminescent elements of the electroluminescent source may be electrically connected in series. The elements connected in series only then require a single common electrical power supply, in other words only a single track of the interposer is needed in order to electrically connect the electronic device and the electroluminescent elements electrically connected in series. It will be understood that it is possible to reduce the number of tracks that need to be "routed" over the interposer when the density of pixels of the source is too high.

The choice of the electroluminescent elements in series may be an arbitrary choice; for example, the elements of the source are connected in series in pairs. This choice may also depend on the conditions of use of the lighting element. For example, if the lighting element is used as a source of illumination and/or a signalling source for a terrestrial vehicle, only certain regions of the electroluminescent source need the full resolution (in other words all the electroluminescent elements must be individually controlled) whereas the other regions require a lower resolution (in other words the electroluminescent elements do not need to be individually controlled).

Figure 3:
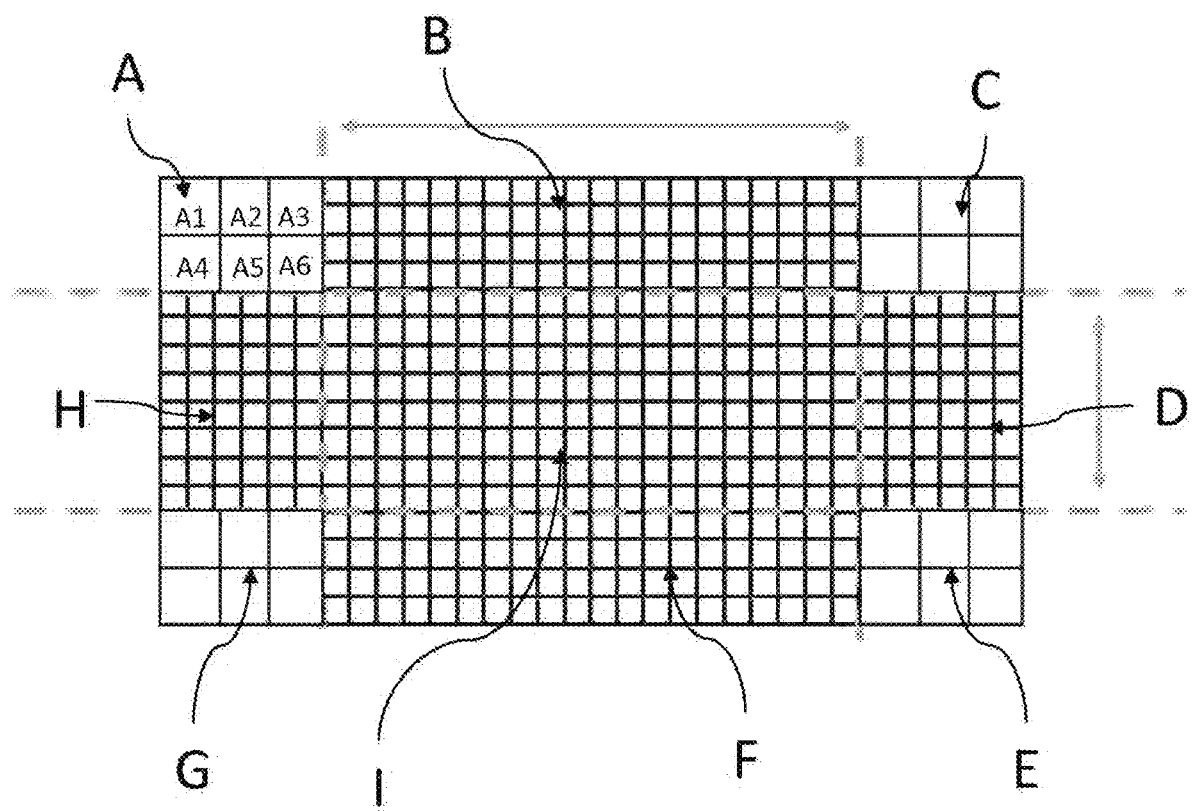
FIG. 3 shows schematically one example of wiring of LEDs of a monolithic array according to the invention.

FIG. 3 illustrates one example in which a monolithic array of LEDs 200 has been subdivided into nine areas. The areas denoted B, D, F, H, I are areas in which the maximum resolution has been conserved: each LED is individually controlled by the electronic device 220. The areas denoted A, C, E, G are areas in which the LEDs have been serialized in order to create groups. For example, the area A is subdivided into six groups A1, A2, A3, A4, A5, and A6, and within each of these groups, the LEDs are connected in series such that only a single track is needed to control them. The areas A, C, E, G are situated on the corners of the array because, in a use of the lighting element as a lighting source for a terrestrial vehicle, the space illuminated by these areas does not require a high resolution as it is on the periphery of the scene being illuminated.

The invention claimed is:

1. A lighting element for a terrestrial vehicle comprising:
   an electroluminescent source comprising at least one electroluminescent element each having a plurality of electrical connectors;
   an electronic device designed to control the electroluminescent element and having a plurality of electrical connectors;
   an interposer electrically connecting the electroluminescent source and the electronic device; and
   a plurality of metal tracks disposed within the interposer, each track connecting at least one electrical connector of the electroluminescent source and at least one electrical connector of electronic device, wherein
   the electroluminescent source is disposed directly adjacent to the electronic device on a same face of the interposer and the plurality of electrical connectors of the electroluminescent source is configured so as to minimize a length of each of the metal tracks, and
   the metal tracks are disposed at different depths within the interposer.

2. The lighting element according to claim 1, wherein a heat dissipator is arranged on one face of the interposer.

3. The lighting element according to claim 2, wherein the heat dissipator is arranged against the face of the interposer via an intermediate element which comprises at least one from amongst:
   a thermal paste;
   a layer of copper; and
   an adhesive.

4. Lighting element according to claim 2, wherein the electroluminescent source and the electronic device are arranged on a second face of the interposer.

5. The lighting element according to claim 1, wherein the interposer comprises at least one from between:
   an inorganic material; and
   an organic material.

6. The lighting element according to claim 5, wherein the inorganic material comprises at least one from amongst:
   silicon;
   glass; and
   ceramic.

7. The lighting element according to claim 1, further comprising a passive and/or active electronic component.

8. The lighting element according to claim 7, wherein the electronic component is arranged in the interposer.

9. The lighting element according to claim 1, wherein:
   the electroluminescent source and the electronic device are arranged on a first face of the interposer; and
   a heat dissipator is arranged against a second face of the interposer.

10. The lighting element according to claim 1, wherein the electronic device comprises at least one power converter and/or one integrated circuit.

11. The lighting element according to claim 1, wherein:
    the electroluminescent source comprises at least two electroluminescent elements electrically connected in series, each of the electroluminescent elements having a plurality of connectors; and
    at least one metal track electrically connects one of the plurality of electrical connector of the electronic device and one of the electrical connectors of each of at least two electroluminescent elements electrically connected in series.

12. The lighting element according to claim 1, wherein the electroluminescent source is a monolithic array of light-emitting diodes.

13. A lighting device, notably a lighting and/or signalling device, for a terrestrial vehicle, comprising a lighting element according to claim 1.

14. The lighting element according to claim 1, wherein a heat dissipator is arranged on one face of the interposer.

15. The lighting element according to Claim I, wherein the electronic device comprises at least one integrated circuit.

16. The lighting element according to claim 1, wherein the metal tracks are disposed parallel to each other and extend in a direction parallel to the face of the interposer.

17. The lighting element according to claim 1, wherein
    first portions of the metal tracks are connected to an electrical connector of the electrokmiinescent source and extend in a depth direction of the interposer;
    second portions of the metal tracks are connected to an electrical connector of the electronic device and extend in the depth direction of the interposer; and
    third portions of the metal tracks extend in a direction parallel the face the interposer and respectively connect one of the first portions to one of the second portions.

18. A lighting element for a terrestrial vehicle comprising:
    an electroluminescent source comprising at least one electroluminescent element each having a plurality of electrical connectors;
    an electronic device designed to control the electroluminescent element and having a plurality of electrical connectors;
    an interposer electrically connecting the electroluminescent source and the electronic device; and
    a plurality of metal tracks disposed within the interposer, each track connecting at least one electrical connector of the electroluminescent source and at least one electrical connector of electronic device, wherein
    the electroluminescent source is disposed directly adjacent to the electronic device on the interposer and the plurality of electrical connectors of the electroluminescent source is configured so as to minimize a length of each of the metal tracks;

the interposer comprises plural peripheral regions and a central region;

each of the peripheral regions includes at least one electroluminescent element:

the electronic device is located in the central region; and metal tracks are provided in the interposer respectively connecting an electrical connector of the electronic device to an electrical connector of each electroluminescent element.

19. The lighting element according to claim 18, wherein:

each of the peripheral regions includes a plurality of electroluminescent elements.

20. The lighting element according to claim 19, wherein the plurality of electroluminescent elements in each of the peripheral regions are connected in series; and for each peripheral region, at least one of the metal tracks provides a connection to each of the series-connected electroluminescent elements.

* * * * *